United States Patent [19]

Hascoe

[11] E Re. 30,348

[45] Reissued Jul. 29, 1980

[54] SOLDER PREFORM

[75] Inventor: Norman Hascoe, Larchmont, N.Y.

[73] Assignee: Semi-Alloys, Inc., Mount Vernon, N.Y.

[21] Appl. No.: 2,325

[22] Filed: Jan. 10, 1979

Related U.S. Patent Documents

Reissue of:

[64] Patent No.: 4,020,987
Issued: May 3, 1977
Appl. No.: 615,545
Filed: Sep. 22, 1975

[51] Int. Cl.[2] ..... B23K 35/26; H01L 23/10

[52] U.S. Cl. ..... 228/56; 428/643

[58] Field of Search ..... 228/56, 246; 428/643, 428/645, 646

[56] References Cited

U.S. PATENT DOCUMENTS

| | | | |
|---|---|---|---|
| 150,623 | 4/1874 | Shaw | 428/646 |
| 2,151,302 | 3/1939 | Scheller | 428/646 X |
| 3,305,389 | 2/1967 | Lowenheim et al. | 428/643 X |
| 3,465,943 | 9/1969 | Clark et al. | 228/246 X |
| 3,639,218 | 2/1972 | Missel | 204/30 |

OTHER PUBLICATIONS

"Brazing and Soldering Alloys-Part I" Mar. 27, 1962 Semi-Alloys Inc., Mt. Vernon, N.Y.

*Primary Examiner*—Francis S. Husar
*Assistant Examiner*—K. J. Ramsey
*Attorney, Agent, or Firm*—Laurence B. Dodds

[57] ABSTRACT

A solder preform for hermetically sealing a cover to a container for a semiconductor package comprises a relatively thick flat ring of an alloy consisting of substantially 95% lead, 2.5% tin, and 2.5% silver, which alloy has the characteristic that it solidifies from the fluid state as a homogeneous mixture without substantial separation of the minority element crystals. The solder preform further comprises a relatively thin coating clad on each surface of the flat ring of an oxidation-resistant alloy, preferably an alloy consisting of substantially 96.5% tin and 3.5% silver.

4 Claims, 2 Drawing Figures

SOLDER PREFORM

Matter enclosed in heavy brackets [ ] appears in the original patent but forms no part of this reissue specification; matter printed in italics indicates the additions made by reissue.

CROSS-REFERENCE TO RELATED APPLICATIONS

The solder preform of the present invention is useful, inter alia, in the fabrication of a hermetically sealed container for a semiconductor device as described and claimed in Applicant's Pat. No. 3,823,468, issued July 16, 1974, and entitled "Method of Fabricating an Hermetically Sealed Container".

BACKGROUND OF THE INVENTION

1. Field of the Invention

The solder preform of the present invention is of particular utility in hermetically sealing a container for a semiconductor device such as an integrated circuit which must be protected from exposure to ambient atmosphere.

2. Description of the Prior Art

In the manufacture of semiconductor devices, there has been a requirement for hermetically sealing the container in which the active semiconductor device is housed, usually a cavity in a metallic or ceramic body. For this purpose, a metallic cover and a solder preform ring have been used. Initially, the cover, the solder preform, and the container were individually assembled and heated to fuse the solder to the cover and to the container as illustrated and described in U.S. Pat. No. 3,340,602 to Hontz. More recently, the solder preform ring has been preattached to the sealing cover and the resulting unit disposed over the container of the semiconductor device and heated to fuse the solder preform to the cover and to the container as illustrated and described in Applicant's U.S. Pat. Nos. 3,823,468 and 3,874,549. This latter method has the advantage that it permits the use of automatic machines for assembling the combination cover-solder preform units and the semiconductor container for fusing the solder unit as described.

In each of the foregoing methods of fabricating hermetically sealed semiconductor packages, it has been customary to use a solder preform formed of an eutectic alloy comprising substantially 80% gold and 20% tin, which has the advantages that it has a desirably high melting point of about 280° C. and it has a high tensile strength, ensuring against breaking of the seal due to shocks or rough handling of the semiconductor package. While such solder preforms are eminently satisfactory in use, the recent extreme increase in the price of gold has made them very costly. In an effort to reduce the cost of such gold-tin solder preforms, solder alloys made from tin, silver, antimony, and other elements have been used to a limited extent but it has been found that they have severe functional limitations in that the melting point of the solder is undesirably low and the tensile strength of the solder joint is low compared to one made of a gold-tin eutectic alloy.

It is an object of the invention, therefore, to provide a new and improved solder preform [for use in hermetically sealing a container for a semiconductor device] which has the desirable characteristics of the gold-tin eutectic solder preform described above but which is must lower in cost.

SUMMARY OF THE INVENTION

In accordance with the invention, a solder preform [for hermetically sealing a cover to a container for a semiconductor package] comprises a relatively thick flat ring of an alloy [consisting of 90–97% lead, 1–4% tin, and 1–4% silver] *comprising preponderantly lead and tin* and having the characteristic that it solidifies from the fluid state as a homogeneous mixture and a relatively thin coating clad on each surface thereof of an oxidation-resistant alloy consisting of 92–98% tin and 2–8% silver.

For a better understanding of the present invention, together with other and further objects thereof, reference is had to the following description, taken in connection with the accompanying drawing, while its scope will be pointed out in the appended claims.

BRIEF DESCRIPTION OF THE DRAWING

FIG. 1 is a perspective view of a portion of a strip of metallic ribbon from which a solder preform of the invention may be punched; while

DESCRIPTION OF THE PREFERRED EMBODIMENT

Figure 1:
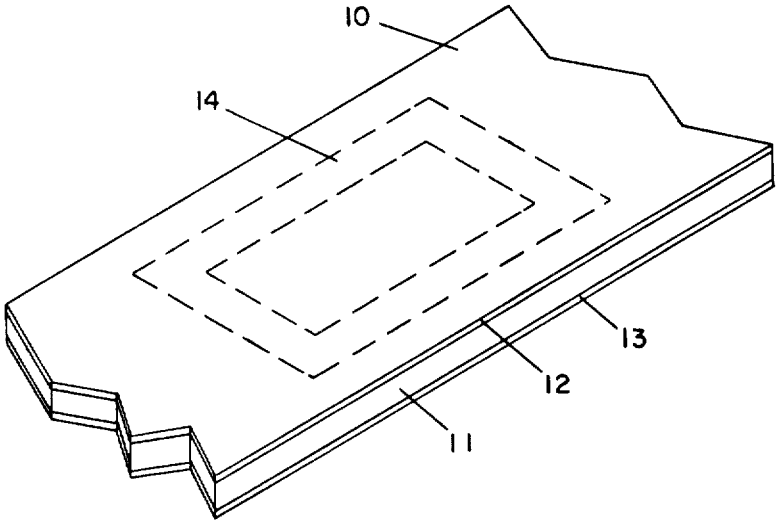

Referring to FIG. 1, there is illustrated a composite metallic strip 10 comprising a central, relatively thick core 11 of an alloy having the characteristic that it solidifies from the fluid state as a homogeneous mixture, for example an alloy consisting of 90–97% lead, 1–4% tin, and 1–4% silver, preferably consisting of substantially 95% lead, 2.5% tin, and 2.5% silver. The core 11 has relatively thin coatings 12, 13 on its upper and lower surfaces respectively, these coatings being of an oxidation-resistant alloy, for example, an alloy consisting of 92–98% tin and 2–8% silver, preferably consisting of substantially 96.5% tin and 3.5% silver. The coatings 12, 13 may be formed on the core 11 by cladding, electroplating, or equivalent process.

Figure 2:
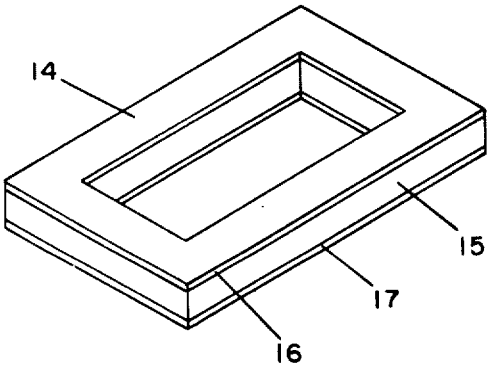
FIG. 2 is a perspective view of a solder preform embodying the invention.

From the strip 10 may be punched a series of solder preform rings such as the ring 14 shown in dashed outline in FIG. 1. The resultant punched solder preform ring 14 is shown in FIG. 2 comprising a central, relatively thick flat ring 15 and upper and lower coatings 16,17 respectively.

As stated, the function of the tin-silver coatings 16,17 on each surface of the lead core or ring 15 is to resist oxidation. Without such a coating, the lead alloy core would oxidize readily and the exposed oxidized surface would inhibit wetting of the solder to the metal cover and to the sealing ring of the semiconductor container. Fluxes to dissolve the oxide cannot be used because such a flux would contaminate the inside of the cavity of the semiconductor container and adversely affect the operation of the semiconductor device in the container.

As stated, the central ring 15 is relatively thick, for example 0.0016 inch, while each of the coatings 16,17 is relatively thin, for example 0.0002 inch.

In the hermetic sealing of a cover to a semiconductor container, as the solder preform ring 14 melts, it wets the cover and the surface of the sealing ring of a semiconductor container and alloying of the outer portions of the tin-alloy coatings 16,17 with the central core 15 of lead alloy takes place. In addition, the tin-alloy coatings 16,17 alloy with the metal plating, usually gold or silver, on the cover and the sealing ring of the container. The resultant solder, after sealing, is very high in lead content and results in a relatively high sealing temperature, typically 275° C. In addition, the high-lead-content solder ring 15 has excellent tensile strength characteristics and compares favorably with the currently accepted gold-tin eutectic solder.

While there has been described what is, at present, considered to be the preferred embodiment of the invention, it will be obvious to those skilled in the art that various changes and modifications may be made therein, without departing from the invention, and it is, therefore, aimed in the appended claims to cover all such changes and modifications as fall within the true spirit and scope of the invention.

What is claimed is:

1. A solder preform [for hermetically sealing a cover to a container for a semiconductor package] comprising a relatively thick flat ring of an alloy consisting of 90–97% lead, 1–4% tin, and 1–4% silver and having the characteristic that it solidifies from the fluid state as a homogeneous mixture and a relatively thin coating clad on each surface thereof of an oxidation-resistant alloy consisting of 92–98% tin and 2–8% silver.

2. A solder preform in accordance with claim 1 in which said ring is an alloy consisting of substantially 95% lead, 2.5% tin, and 2.5% silver.

3. A solder preform in accordance with claim 1 in which said coating is an alloy consisting of substantially 96.5% tin and 3.5% silver.

*4. A solder preform comprising a relatively thick flat ring of an alloy comprising preponderantly lead and tin and having the characteristic that it solidifies from the fluid state as a homogeneous mixture and a relatively thin coating clad on each surface thereof of an oxidation-resistant alloy consisting of 92–98% tin and 2–8% silver.*

* * * * *